United States Patent [19]

Molthen

[11] 4,080,585
[45] * Mar. 21, 1978

[54] FLAT COIL TRANSFORMER FOR ELECTRONIC CIRCUIT BOARDS

[75] Inventor: Edward Henry Molthen, Ramona, Calif.

[73] Assignee: Cubic Corporation, San Diego, Calif.

[ * ] Notice: The portion of the term of this patent subsequent to Nov. 16, 1993, has been disclaimed.

[21] Appl. No.: 786,332

[22] Filed: Apr. 11, 1977

[51] Int. Cl.² .......................... H01F 5/00; H01F 27/28
[52] U.S. Cl. .................................................. 336/200
[58] Field of Search .............. 336/200, 183, 232, 225; 174/68.5; 29/605, 602; 338/283, 290, 284, 285, 286, 287, 289, 292, 293, 294

[56] References Cited

U.S. PATENT DOCUMENTS

| | | | |
|---|---|---|---|
| 2,971,173 | 2/1961 | Kajihara | 336/183 X |
| 3,085,899 | 4/1963 | Forman | 336/200 UX |
| 3,305,814 | 2/1967 | Moyer | 336/200 |
| 3,486,149 | 12/1969 | Klein | 336/200 X |
| 3,590,329 | 6/1971 | Krepps, Jr. | 336/183 X |
| 3,721,932 | 3/1973 | Fierstien et al. | 336/183 X |
| 3,737,824 | 6/1973 | Coles | 336/200 |
| 3,843,495 | 12/1969 | Clark et al. | 336/200 X |
| 3,992,691 | 11/1976 | Molthen | 336/200 |

FOREIGN PATENT DOCUMENTS

46-32609  5/1967  Japan ..................................... 336/200

Primary Examiner—Thomas J. Kozma
Attorney, Agent, or Firm—Brown & Martin

[57] ABSTRACT

A flat coil transformer on an electronic circuit board. The primary winding consists of a first helical conductive pattern formed by alternately spaced straps of a first series of conductive straps on one surface of the circuit board, alternately spaced straps of a second series of straps on the opposite surface of the circuit board, and alternately spaced holes of first and second generally parallel series of conductive coated holes extending through the board and connecting together the alternately spaced straps of the first and second series of straps. The secondary winding consists of a second helical conductive pattern formed by the remaining alternately spaced straps of the first series of straps, the remaining alternately spaced straps of the second series of straps, and the remaining alternately spaced holes of the first and second series of holes connecting together the remaining alternately spaced straps of the first and second series of straps. The first and second helical patterns each have a longitudinal axis that is generally parallel to the first and second series of holes; and the holes in the first helical pattern are staggered laterally in relation to the holes in the second helical pattern.

4 Claims, 4 Drawing Figures

FLAT COIL TRANSFORMER FOR ELECTRONIC CIRCUIT BOARDS

BACKGROUND OF THE INVENTION

The present invention generally pertains to electronic circuit boards and is particularly directed to a transformer for use on such boards.

In designing circuits which are embodied on electronic circuit boards, sometimes it is desirable to include a transformer for performing such functions as providing an impedance transformation for coupling energy from an oscillator to an RF amplifier, or for suppressing unwanted signal components.

However, conventional transformers are bulky and are not readily fitted on compact electronic circuit boards. As a result there often is a tendency to design around a combination of circuit elements requiring a transformer.

Although the use of flat coil inductors on electronic circuit boards is described in U.S. Pat. No. 3,185,947 to Freymodsson entitled "Inductive Module for Electronic Devices", as well as in applicant's U.S. Pat. No. 3,992,691 entitled "Electronic Circuit Board Flat Coil Inductor", the design of a flat coil transformer for an electronic circuit board heretofore has not been described in the prior art; and even through Freymodsson suggests that the design shown in his patent could be adapted for the fabrication of transformers, he does not describe how such could be accomplished.

SUMMARY OF THE INVENTION

In accordance with the present invention the design described in applicant's U.S. Pat. No. 3,992,691 is adapted to provide a flat coil transformer for electronic circuit boards.

Those portions of applicant's flat coil inductor design that are incorporated into the transformer of the present invention include a circuit board having first and second spaced, generally flat electrically insulative opposed surfaces, and having at least a first and a second series of holes extending along these surfaces and extending through the board, wherein the first series of holes is generally parallel to the second series of holes; a first conductive pattern on the first surface of the board and including a first series of straps extending between the first and second series of holes; and a second conductive pattern on the second surface of the board and including a second series of straps extending between the first and second series of holes. At least a portion of the walls of the holes are coated with a conductive layer to complete an electrical circuit through the straps and holes to form at least one generally helical conductive pattern.

The flat coil transformer of the present invention is characterized by a primary winding consisting of a first such helical conductive pattern including alternately spaced straps of the first series of straps, alternately spaced straps of the second series of straps, and alternately spaced straps of the second series of straps, and alternately spaced conductively coated holes of the first and second series of holes connecting together the alternately spaced straps of the first and second series of straps; and a secondary winding consisting of a second such helical conductive pattern including the remaining alternately spaced straps of the first series of straps, the remaining alternately spaced straps of said second series of straps, and the remaining alternately spaced conductive coated holes of the first and second series of holes connecting together the remaining alternately spaced straps of the first and second series of straps.

The first and second helical patterns each have a longitudinal axis that is generally parallel to the first and second series of holes. The holes in the first helical pattern are staggered laterally in relation to the holes in the second helical pattern; and in one preferred embodiment, the longitudinal axes of the first and second helical patterns are separated from each other. By selecting the amount of separation, if any, between the first and second helical patterns the extent of coupling between the primary and secondary windings can be selected.

DESCRIPTION OF THE PREFERRED EMBODIMENTS

Figure 1A:
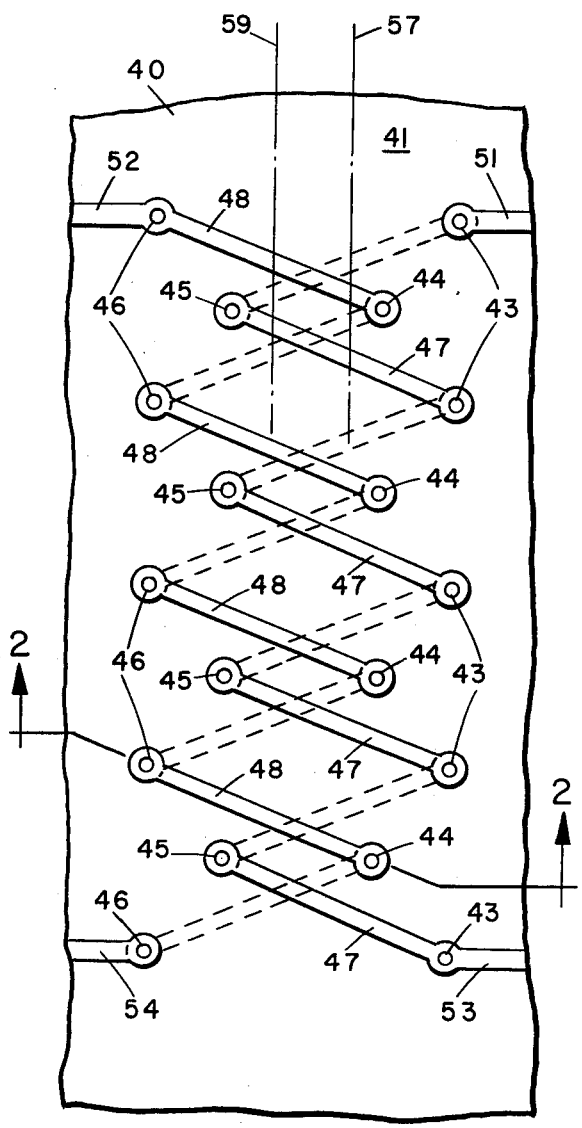
FIGS. 1A and 1B respectively illustrate opposite surfaces of a portion of an electronic circuit board containing one preferred embodiment of a flat coil transformer.
Figure 1B:
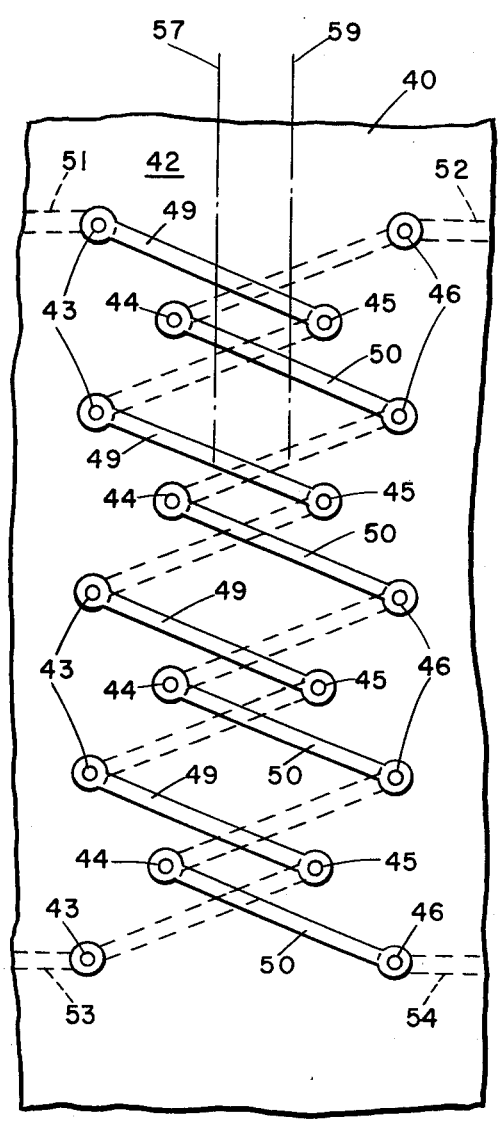

Referring to FIGS. 1A and 1B, there is illustrated one preferred embodiment of a flat coil transformer according to the present invention. The transformer is formed on an electronic circuit board 40. The electronic circuit board 40 is made of fiberglass or other material having substantial mechanical strength and with electrically insulative surfaces. The board 40 has a first flat surface 41 and a second flat surface 42 on the opposite side of the board 40. Various circuit components (not shown) are mounted on the board 40.

The circuit board 40 has a first series of holes 43, 44 and a second series of holes 45, 46, extending along the board surfaces 41 and 42 and extending through the board 40. The first series of holes 43, 44 is generally parallel to the second series of holes 45, 46.

On the first surface 41 of the board 40, there is a first series of conductive straps 47, 48 extending between the first series of holes 43, 44 and the second series of holes 45, 46. On the second surface 42 of the board 40, there is a second series of conductive straps 49, 50 extending between the first series of holes 43, 44 and the second series of holes 45, 46. The straps 47, 48, 49, 50 are an electrically conductive material.

The thickness of the conductive layer in the conductively coated holes 43, 44, 45, 46 is such that a clear opening remains between the two surfaces of the board into which a lead from a component may be inserted. In the preferred embodiment, (see FIG. 2), the holes 44, 46 are first drilled to a dimension of .034 inches. The conductive coating 19 accounts for .003 inches of the diameter of the hole with the resulting finished hole opening being .031 inches. Thus, the finished opening corresponds to the lead diameter of many standard components.

Figure 3:
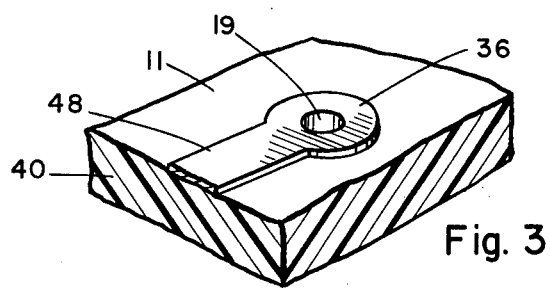
FIG. 3 is a perspective view of one end of a conductive strap extending to a conductively coated hole.

Referring now to FIG. 3, it will be noted that each of the straps, such as strap 48, terminates in a pad 36 surrounding the conductively coated holes. The pads 36 are desirable to maximize the integrity of the electrical connections between the straps and conductively coated holes.

In the manufacture of a flat coil transformer according to the present invention, the fiberglass board is first plated with copper. Secondly, the series of holes 43, 44, 45, 46 are drilled through the board 40. Photoresist material is then applied over the entire board and holes. The photoresist is developed in those areas where it is desired to remove the electrically conductive copper. The developed photoresist is then washed away leaving a protective coating over the areas that are to have copper remain. The copper is etched from the board in all of the unprotected areas. High temperature oil is utilized to clean away the developed photoresist and exposes the copper and the holes. A copper layer is coated on the walls of the holes by an electroplating process. A tin-lead solder (not illustrated) is applied in a thin layer extending along all of the copper surfaces and between the copper surfaces in the holes. The resulting helical patterns are mechanically strong.

FIGS. 1A and 1B illustrate an embodiment of the flat coil transformer of the present invention wherein the longitudinal axis of the helical conductive patterns forming the primary and secondary windings are separated to select the extent of coupling between the primary and secondary windings.

Figure 2:
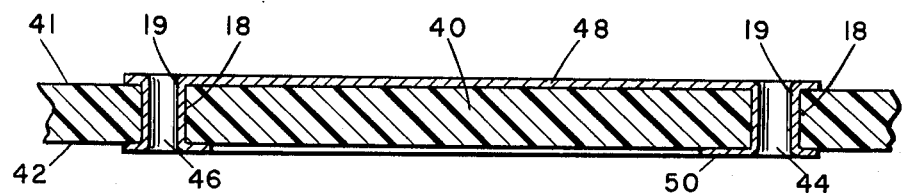
FIG. 2 is an enlarged sectional view taken on line 3-3 of FIG. 1A.

Referring to FIGS. 2 and 3 the walls 18 of the holes 43, 44, 45, 46 are coated with a conductive layer to complete an electrical circuit through the straps and holes, thereby forming two generally helical conductive patterns which constitute the primary and secondary windings of the flat coil transformer.

The primary winding extends from terminal strip 51 to terminal strip 53 and includes alternately spaced straps 47, of the first series of straps, alternately spaced straps 49 of the second series of straps, and alternately spaced conductively coated holes 43, 45 of the first and second series of holes, which connect together the alternately spaced straps 47 and 49.

The secondary winding extends from terminal strip 52 to terminal strip 54 and includes the remaining alternately spaced straps 48 of the first series of straps, the remaining alternately spaced straps 50 of the second series of straps, and the remaining alternately spaced conductively coated holes 44, 46 of the first and second series of holes which connect together the remaining alternately spaced straps 48 and 50.

It is seen in FIGS. 1A and 1B that the helical pattern forming the primary winding has a longitudinal axis 57 and that the helical pattern forming the secondary winding has a longitudinal axis 59. Both of these longitudinal axes 57, 59 are generally parallel to said first series of holes 43, 44 and the second series of holes 45, 46. The holes 43, 45 in the helical pattern forming the primary winding are staggered laterally in relation to the holes 44, 46 in the helical pattern forming the secondary winding; and the longitudinal axes 57 and 59 of the two helical patterns are separated from one another.

The extent of coupling between the primary and secondary windings is dependent upon the extent of the separation between the longitudinal axes 57 and 59.

I claim:

1. A flat coil transformer for electronic circuit boards comprising:

a circuit board having first and second spaced, generally flat electrically insulative opposed surfaces, and having at least a first and a second series of holes extending along said surfaces and extending through said board, wherein said first series of holes is generally parallel to said second series of holes;

a first conductive pattern on said first surface of said board and comprising a first series of straps extending between the said first and second series of holes; and a second conductive pattern on said second surface of said board and comprising a second series of straps extending between said first and second series of holes;

wherein at least a portion of the walls of said holes are coated with a conductive layer to complete an electrical circuit through said straps and holes forming at least one generally helical conductive pattern;

a primary winding consisting of a first said helical conductive pattern comprising alternately spaced straps of said first series of straps, alternately spaced straps of said second series of straps, and alternately spaced conductively coated holes of said first and second series of holes connecting together said alternately spaced straps of said first and second series of straps; and a secondary winding consisting of a second said helical conductive pattern comprising the remaining alternately spaced straps of said first series of straps, the remaining alternately spaced straps of said second series of straps, and the remaining alternately spaced conductively coated holes of said first and second series of holes connecting together the remaining alternately spaced straps of the said first and second series of straps;

wherein said first and second helical patterns each have a longitudinal axis that is generally parallel to said first and second series of holes;

characterized by said holes in said first helical pattern being staggered laterally in relation to said holes in said second helical pattern.

2. A transformer according to claim 1, wherein said longitudinal axes of said first and second helical patterns are separated from one another.

3. A transformer according to claim 2, wherein the helical conductive pattern of one of the windings further comprises consecutively spaced straps of said first series of straps, consecutively spaced straps of said second series of straps, and consecutively spaced holes of said first and second series of holes extending beyond the alternately spaced straps and holes.

4. A transformer according to claim 1, wherein the helical conductive pattern of one of the windings further comprises consecutively spaced straps of said first series of straps, consecutively spaced straps of said second series of straps, and consecutively spaced holes of said first and second series of holes extending beyond the alternately spaced straps and holes.

* * * * *